(12) United States Patent
Baek et al.

(10) Patent No.: US 8,138,957 B2
(45) Date of Patent: Mar. 20, 2012

(54) DIRECT DIGITAL FREQUENCY SYNTHESIZER USING HYBRID DIGITAL TO ANALOG CONVERTER AND SYNTHESIZING METHOD THEREOF

(75) Inventors: Kwang-Hyun Baek, Seoul (KR); Hong Chang Yeoh, Seoul (KR); Jae-Hun Jung, Seoul (KR); Yun-Hwan Jung, Seoul (KR)

(73) Assignee: Chung-Ang University Academy-Cooperation Foundation, Seoul (KR)

( * ) Notice: Subject to any disclaimer, the term of this patent is extended or adjusted under 35 U.S.C. 154(b) by 247 days.

(21) Appl. No.: 12/626,565

(22) Filed: Nov. 25, 2009

(65) Prior Publication Data

US 2011/0043258 A1    Feb. 24, 2011

(30) Foreign Application Priority Data

Aug. 19, 2009  (KR) .................. 10-2009-0076716

(51) Int. Cl.
*H03M 1/66* (2006.01)
(52) U.S. Cl. ............... 341/144; 455/192.2; 375/295; 375/241; 375/344

(58) Field of Classification Search .......... 341/140–150; 375/295, 241, 240, 344; 455/192.2
See application file for complete search history.

(56) References Cited

U.S. PATENT DOCUMENTS

| | | | |
|---|---|---|---|
| 6,950,045 B2 * | 9/2005 | Kim ............................. 341/118 |
| 7,209,055 B1 * | 4/2007 | Stovall et al. ................... 341/14 |
| 7,768,435 B2 * | 8/2010 | Montvelishsky ............. 341/144 |
| 7,852,250 B2 * | 12/2010 | Chuang et al. ................ 341/144 |
| 7,928,881 B1 * | 4/2011 | Baek et al. .................... 341/145 |
| 7,978,110 B2 * | 7/2011 | Lai et al. ....................... 341/145 |
| 8,013,771 B2 * | 9/2011 | Booth et al. .................. 341/144 |
| 2003/0058973 A1 * | 3/2003 | Tsecouras ..................... 375/344 |

* cited by examiner

*Primary Examiner* — Lam T Mai
(74) *Attorney, Agent, or Firm* — John L. DeAngelis; Beusse Wolter Sanks Mora & Maire, P.A.

(57) ABSTRACT

A direct digital frequency synthesizer and a synthesizing method thereof. The direct digital frequency synthesizer uses a hybrid digital to analog converter, which matches output data of a phase accumulator to a sine wave amplitude using a hybrid DAC, including a non-linear DAC and a linear DAC. The non-linear DAC outputs a direct base point current using some bits of output data of a phase accumulator, causing the linear DAC to output a gradient current based on gradient information generated using other bits of the output data of the phase accumulator. These currents are summed for the analog output.

13 Claims, 11 Drawing Sheets

FIG. 7

| Segment | Weight | Segment | Weight |
|---|---|---|---|
| 1 | 0 | 17 | 2897 |
| 2 | 201 | 18 | 3035 |
| 3 | 401 | 19 | 3165 |
| 4 | 601 | 20 | 3289 |
| 5 | 799 | 21 | 3405 |
| 6 | 995 | 22 | 3513 |
| 7 | 1188 | 23 | 3611 |
| 8 | 1379 | 24 | 3703 |
| 9 | 1566 | 25 | 3784 |
| 10 | 1750 | 26 | 3856 |
| 11 | 1930 | 27 | 3918 |
| 12 | 2107 | 28 | 3973 |
| 13 | 2278 | 29 | 4017 |
| 14 | 2440 | 30 | 4076 |
| 15 | 2598 | 31 | 4091 |
| 16 | 2751 | | |

DIRECT DIGITAL FREQUENCY SYNTHESIZER USING HYBRID DIGITAL TO ANALOG CONVERTER AND SYNTHESIZING METHOD THEREOF

BACKGROUND OF THE INVENTION

1. Field of the Invention

The present invention relates to direct digital frequency synthesis, and more particularly, to a direct digital frequency synthesizer using a hybrid digital to analog converter, which is capable of synthesizing an analog signal with high quality without base decoding, thereby providing improved size and efficiency, and a synthesizing method thereof.

2. Description of the Related Art

With the necessity of high speed processing systems with advance of information & communication technologies, there is an increasing need of high speed digital frequency synthesis systems which are capable of synthesizing a desired frequency at a high speed with minimal latency.

In general, a frequency synthesis system includes a direct frequency type and an indirect frequency type. The indirect frequency type, such as a phase locked loop (PLL) frequency synthesizer, requires a voltage controlled oscillator (VCO), thereby producing phase noises, and has a feedback loop, thereby providing great latency for frequency synthesis. For the purpose of overcoming this problem, there have been mainly used direct digital frequency synthesizers with small latency for frequency synthesis, small phase noise, and for precise and high speed frequency synthesis.

Since a direct digital frequency synthesizer (DDFS) is capable of instantaneous phase and frequency conversion over a wide band and provision of correct phase and frequency without signal discontinuity owing to a merit of digital processing, it is suitable for high speed precise frequency synthesis and is mainly applied to radars and wireless communications requiring regular high agility frequency hopping. The direct digital frequency synthesizer has an increasing application range to various fields for applications by simplifying its hardware configuration and hence reducing production costs. In addition, since portions except for a digital to analog converter (DAC) are implemented by digital circuits, use of DDFSs is on the rise with increase of integration of semiconductor integrated circuits.

FIG. 1 shows a general DDFS configuration. As shown, a DDFS includes a phase accumulator 10 for accumulating frequency control words (FCWs) to generate new phase data for each segmented clocks with phase angles (0 to 2p) around a circle through overflow, a phase to amplitude mapper (PAM) 20 for discretely mapping the phase data provided by the phase accumulator 10 onto amplitudes corresponding to sine waves, and a digital to analog converter (DAC) 30 for converting discrete amplitudes provided by the PAM 20 into an analog signal having a desired frequency form.

Methods of mapping phase onto amplitude in the PAM 20 may include, for example, a method of using a read only memory (ROM), a method of using Taylor series, a method of using a coordinated rotation digital computer (CORDIC), etc.

Although the method of using ROM provides various schemes for size reduction, this method is still low in space efficiency and has additional complicated circuits for size reduction, thereby consuming much power. Therefore, the method of using Taylor series or the method of using CORDIC has been indeed used to minimize the use of ROM.

However, both of the method of using Taylor series and the method of using CORDIC require a very complicated operation configuration and still a ROM of a look-up table scale, thereby still raising a problem of high power consumption and delay due to complexity without providing particular integration efficiency.

To overcome this problem, there has been recently proposed a DDFS structure having a relatively less complicated control configuration without using a ROM. For example, U.S. Patent publication No. US20070174371 discloses a hardware-efficient phase-to-amplitude mapping design for direct digital frequency synthesizer using a method of configuring a PAM for converting a FCW into a binary code having amplitude of a sine waveform and a DAC for converting the binary code into a sine wave.

FIG. 2 shows a DDFS configuration disclosed in U.S. Patent publication No. US20070174371. As shown, a DDFS includes a PAM 40 to receive a 14-bit output provided from a phase accumulator, and a linear DAC 50. The PAM 40 is configured to use 5 bits, which are some of the output, to set base points to set a basic position of amplitude with low resolution, 7 bits, which are some of the output, to set an extension amplitude value for linear approximation in conformity to a sine waveform between base points, and 2 bits, which are the remaining of the output, to extensionally map a ¼ sine wave amplitude accordingly obtained onto a sine wave of one period as a whole. The linear DAC 50 is configured to convert a single binary value for the sine wave amplitude output from the PAM 40 into an analog value.

Although the linear DAC 50 may be configured as a single linear DAC in which the shown entire 12 bits have a binary weight, the hardware configuration may be simplified by configuring some upper bits to be processed by a linear DAC 51 applying a thermometer decoder and configuring the remaining lower bits to be processed by a DAC 52 to which a binary weight is applied. It is here noted that the bits divided and processed by the PAM 40 are independent of the internal DAC configuration bits of the linear DAC 50.

The PAM 40 operates to map phase data output from the phase accumulator onto binary values of a precise sine waveform. Specifically, of the data of 14 bits provided by the accumulator, the upper 2 bits are used to control operation of a first complementor 41 and a second complementor 46 for specifying a position of the ¼ sine wave amplitude on a 4-quadrant, the next upper 5 bits are analyzed by a base decoder 42 when then outputs information of 12 bits to specify base points which are positions of base amplitudes having low resolution. A controller 43 uses the next upper 5 bits to generate a 16-bit signal for generating predetermined gradients for linear approximation between the base points and a 4-bit signal for specifying a combination of addition or subtraction of the generated gradients. A gradient generator 44 uses the lower 7 bits of the 14-bit data provided by the phase accumulator and the 16-bit signal provided by the controller 43 to generate 8 kinds of different gradients (by using T-Term blocks). A 12-bit operator 45 carries out an operation for the 4 of the 8 kinds of 8-bit gradient values provided by the gradient generator 44, the combination information of the gradient values provided by the controller 43, and the 12-bit base point information provided by the base decoder 12 to output 11-bit binary information on amplitude. The second complementor 46 outputs an amplitude for a complete entire sine wave phase of the total of 12 bits having shifting information on top and bottom positions of the amplitude, included in one most significant bit, as binary values.

In the end, the above method is a method of setting positions of base amplitudes having low resolution by means of the base decoder 42 and approximating a gradient interconnecting points between the set base amplitudes (that is, coarse segments for amplitude) by combining a plurality of gradient values, thereby generating final binary information in the PAM in consideration of all of them.

Although the above-described method may configure a DDFS with no ROM, it requires pipelines of a considerable size for high speed operation and still has a problem of configuration of complicated operators. In addition, since an output of PAM has a binary value for designation of single amplitude, its resolution is fixed at the set number of bits.

That is, as shown, a considerably complicated logic configuration is required for the base decoder 42 for obtaining base points, and 12-bit pipelines are required for its output. In addition, the 12-bit operator 45 having the same size as output bits of the base decoder 42 is required for operation of such base points and gradients, and also pipelines are required accordingly, which results in complexity of configuration. Such complexity of configuration leads to low integration, high costs, high power consumption and operation delay. Accordingly, such an existing complicated configuration has to be simplified for expansion of an application range of DDFS.

In the end, there is a need of DDFS of a new form which is capable of increasing integration, saving power and maintaining or improving output quality by overcoming such configuration complexity and simplifying a configuration of PAM, which occupies most of an actual total area, to decrease its area.

SUMMARY OF THE INVENTION

In order to overcome the above problems, it is an object of the present invention to provide a direct digital frequency synthesizer using a hybrid digital to analog converter, and a synthesizing method thereof, which are capable of simplifying a configuration of a PAM which converts output data of a phase accumulator to sine wave with an application of a hybrid DAC including a non-linear DAC and a linear DAC, without increase of complexity of a DAC, by causing the non-linear DAC to output a direct base point current using some bits of output data of a phase accumulator, causing the linear DAC to output a gradient current based on gradient information generated using other bits of the output data of the phase accumulator, and summing these currents for analog output.

It is another object of the present invention to provide a direct digital frequency synthesizer using a hybrid digital to analog converter, and a synthesizing method thereof, which are capable of essentially eliminating a necessity to sum base points and gradients in a PAM and thereby significantly simplifying a configuration of an operator and a complicated configuration of pipelines required for generation and operation of base points by causing a hybrid DAC to directly generate base point values and thereby separating a base point processing configuration from a gradient processing configuration.

It is still another object of the present invention to provide a direct digital frequency synthesizer using a hybrid digital to analog converter, and a synthesizing method thereof, which are capable of maximizing an improvement effect by simplification of a PAM configuration by preventing increase of DAC structure complexity due to non-linear DAC application by changing a linear DAC part using a thermometer decoder used in existing linear DACs to a non-linear DAC part using a thermometer decoder.

It is yet still another object of the present invention to provide a direct digital frequency synthesizer using a hybrid digital to analog converter, and a synthesizing method thereof, which are capable of providing higher output resolution, significantly simplifying a DAC configuration, greatly improving its integration, and greatly decreasing power consumption even in the event of using a DAC configuration similar to existing DAC configurations.

It is yet still another object of the present invention to provide a direct digital frequency synthesizer using a hybrid digital to analog converter, and a synthesizing method thereof, which are capable of simplifying a DAC configuration while providing output resolution similar to existing output resolution.

To achieve the above objects, according to an aspect of the invention, there is provided a direct digital frequency synthesizer using a hybrid digital to analog converter, that includes a non-linear DAC part for generating a current corresponding to base points in a non-linear manner, and a linear DAC part for generating a current corresponding to a gradient for linear approximation, which interconnects the base points, and sums and outputs the currents of the DAC parts; and a PAM (phase to amplitude mapper) that provides upper first data of output data of an external phase accumulator to the non-linear DAC part of the hybrid DAC, generates a gradient using the first data and lower second data of the output data, and provides the generated gradient to the linear DAC part of the hybrid DAC.

Preferably, the PAM includes a plurality of complementors that uses the uppermost third data of the output data of the phase accumulator to locate the correct guardant with respect to amplitude of a quarter sine wave region operated using the first and second data.

Preferably, the hybrid DAC further includes a one-bit DAC that uses one bit of the third data to determine whether or not amplitude obtained through the non-linear DAC part and the linear DAC part is shifted.

Preferably, the PAM includes: a first complementor that uses the third data corresponding to the most significant two bits of the output data of the phase accumulator to perform a selectively complementary operation for the first data and the second data, and provides the selectively complementary-operated first data to the non-linear DAC part; a gradient generator that uses the first data and the second data selectively complementary-operated in the first complementor to generate unit gradients, and performs an addition/subtraction combining operation to generate binary values of linear approximation values using the selectively complementary-operated second data; and a second complementor that uses the third data to perform a selectively complementary operation for an output of the gradient generator, and provides the selectively complementary-operated output to the linear DAC part.

Preferably, the non-linear DAC of the hybrid DAC is configured by a DAC having less than 5 bits as an input.

Preferably, the non-linear DAC of the hybrid DAC includes: a thermometer decoder that provides a single selection output according to input data; switches of the number corresponding to the number of outputs of the thermometer decoder, the switches being operated depending on values selected by the thermometer decoder; and a non-linear current source connected to each of the switches for providing a non-linear current.

Preferably, the hybrid DAC further includes a delay block that delays the operation of the linear DAC to synchronize the operation of the thermometer decoder included in the non-linear DAC with the operation of the linear DAC.

Preferably, the direct digital frequency synthesizer further comprises a complementor that is interposed between the thermometer and the switches for selecting a quadrant using the third data provided by the phase accumulator.

Preferably, the hybrid DAC includes a one-bit linear DAC that shifts generation amplitude according to shifting-designation data of the data provided by the phase accumulator, a non-linear DAC of less than 5 bits that generates a current corresponding to base points according to base point-designation data, and a linear binary DAC of less than 7 bits that generates a current according to a gradient between the base points based on binary values for a linear approximation gradient.

According to another aspect of the invention, there is provided a direct digital frequency synthesizing method using a hybrid digital to analog converter, including: a data division step of dividing an output of a phase accumulator into first data for base point designation and second data for linear approximation; a base point mapping step of directly providing the first data to a non-linear DAC of a hybrid DAC including the non-linear DAC and a linear DAC; a gradient generation step of generating binary values for a gradient for linear approximation using the second data and the first data and providing the generated binary values to the linear DAC; and a conversion step of generating base point currents in the non-linear DAC by connecting a non-linear current source corresponding to the first data to the non-linear DAC, and generating and summing expansion gradient currents corresponding to the gradient binary values in the linear DAC.

Preferably, the output of the phase accumulator further includes third data of the most significant two bits for phase determination of quarter sine wave amplitude in the data division step, the direct digital frequency synthesizing method further comprises: a first expansion step of selectively converting the first and second data into complementary numbers according to the third data before the base point matching step and the gradient generation step; and a second expansion step of selectively performing the complementary operation according to the third data after the gradient generation step and during generation of the base point currents of the non-linear DAC in the conversion step.

Preferably, the hybrid DAC includes a one-bit DAC for selective shifting depending on the phase determination, and the second expansion step further includes a step of determining whether or not the shifting is performed according to one bit from the third data.

Preferably, the conversion step includes a step in which the non-linear DAC thermometer-decodes the first data received, selects one of switches of the number corresponding to the number of outputs of a thermometer decoder, selects one of current sources having a non-linear size for each of the switches, and outputs an output of the sum of selected current source as a base point current.

According to the embodiment of the present invention, since the direct digital frequency synthesizer using a hybrid digital to analog converter, and a synthesizing method thereof are capable of simplifying a configuration of a PAM which matches output data of a phase accumulator to sine wave amplitude with an application of a hybrid DAC including a non-linear DAC and a linear DAC, without increase of complexity of a DAC, by causing the non-linear DAC to output a direct base point current using some bits of output data of a phase accumulator, causing the linear DAC to output a gradient current based on gradient information generated using other bits of the output data of the phase accumulator, and summing these currents for analog output, an effect of greatly reducing a size and power consumption can be achieved.

According to the embodiment of the present invention, since the direct digital frequency synthesizer using a hybrid digital to analog converter, and a synthesizing method thereof are capable of essentially eliminating a necessity to sum base points and gradients in a PAM and thereby significantly simplifying a configuration of an operator and a complicated configuration of pipelines required for generation and operation of base points by causing a hybrid DAC to directly generate base point values and thereby separating a base point processing configuration from a gradient processing configuration, an effect of increasing integration, reducing delay and reducing power consumption can be achieved.

According to the embodiment of the present invention, the direct digital frequency synthesizer using a hybrid digital to analog converter, and a synthesizing method thereof, which are capable of maximizing an improvement effect by simplification of a PAM configuration by preventing increase of DAC structure complexity due to non-linear DAC application by changing a thermometer based linear DAC in existing linear DACs to a thermometer based non-linear DAC.

According to the embodiment of the present invention, the direct digital frequency synthesizer using a hybrid digital to analog converter and a synthesizing method thereof have an effect of providing higher output resolution and significantly simplifying a DAC configuration even in the event of using a DAC configuration similar to existing DAC configurations.

According to the embodiment of the present invention, the direct digital frequency synthesizer using a hybrid digital to analog converter and a synthesizing method thereof have an effect of providing a sufficient performance in small size and power consumption environments by simplifying a DAC configuration while providing output resolution similar to existing output resolution.

BRIEF DESCRIPTION OF THE DRAWINGS

The above and/or other aspects and advantages of the present invention will become apparent and more readily appreciated from the following description of the embodiments, taken in conjunction with the accompanying drawings of which:

FIG. 7 is a view showing weights of a non-linear DAC according to an embodiment of the present invention;

DETAILED DESCRIPTION OF THE PREFERRED EMBODIMENT

Hereinafter, the present invention will be described in detail by way of exemplary embodiments in conjunction with the accompanying drawings.

Figure 1:
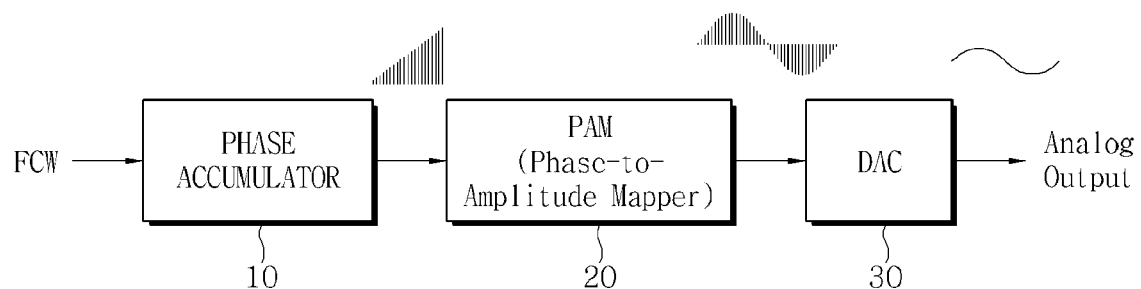
FIG. 1 is a view showing a configuration of a general direct digital frequency synthesizer.
Figure 2:
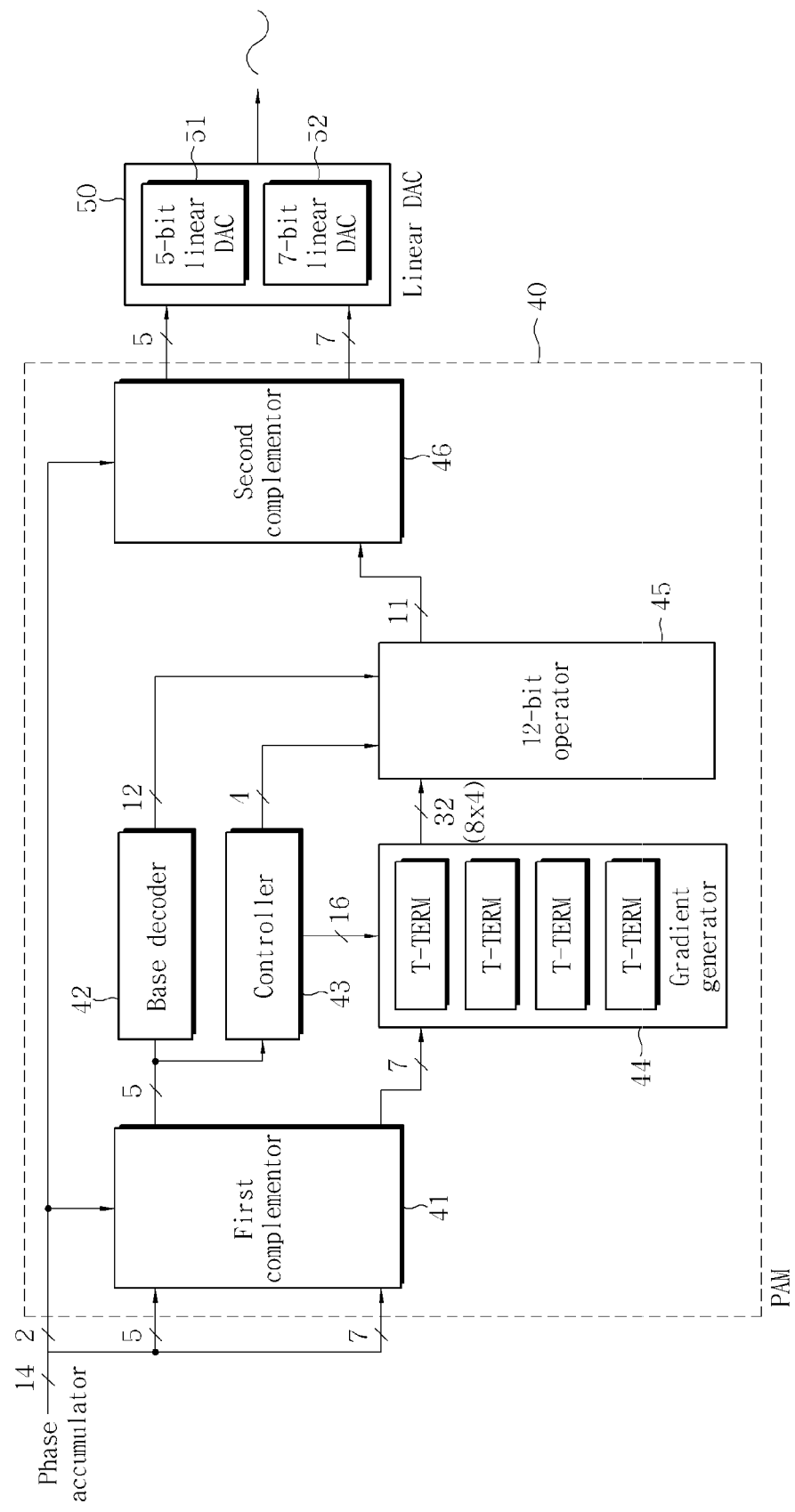
FIG. 2 is a view showing a configuration of a conventional direct digital frequency synthesizer.
Figure 3:
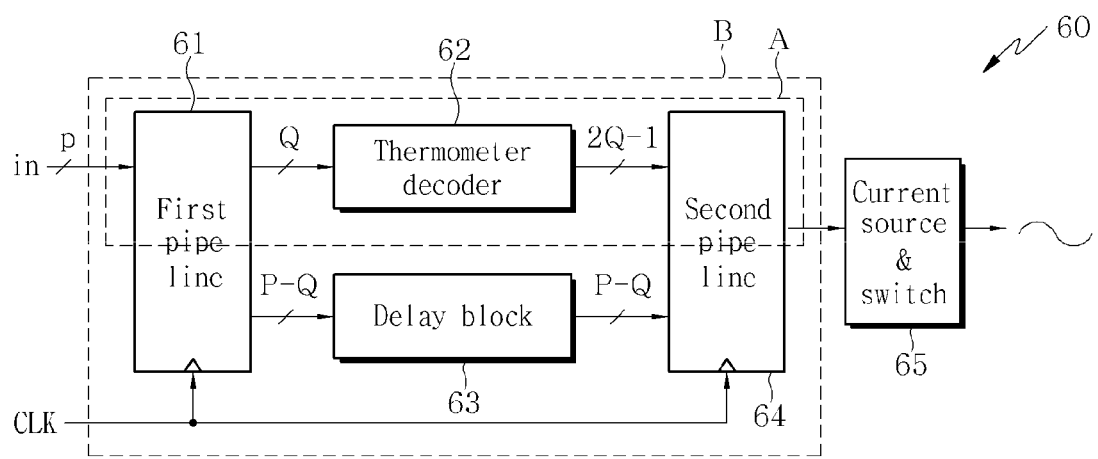
FIG. 3 is a view showing a configuration of a general linear DAC.

FIG. 3 shows a configuration of a linear DAC used in the prior art for explaining the present invention. As shown, the existing linear DAC 60 applied in FIG. 2 provides an analog output and, to this end, includes a first pipeline 61 for processing a binary sine wave amplitude of p bits (for example, 12 bits) in parallel, a thermometer decoder 62 for processing q bits (for example, 5 bits), which are some upper bits of the p bits, to output the combinable number ($2^q$–1) of the q bits, a delay block for delaying process time by the thermometer decoder 62 in order to process the remaining bits (p-q) along with the q bits, a second pipeline 64 for processing outputs of the thermometer decoder 62 and the delay block 63 in parallel, and a current source & switch 65 for selecting a current source having a linear configuration with the output of the second pipeline 64.

When the region (B) shown in the form of linear binary DAC to provide a desired output with a switch combination according to binary values is configured, it is difficult to configure current sources of the current source & switch 65 linearly increased with increase of resolution. For example, 11 different current sources have to be configured for 12 bits, with the largest current source being 2048 times as large as the smallest current source.

Accordingly, as shown, some upper bits are configured by a thermometer decoder DAC (A) using the thermometer decoder 62, while the remaining lower bits are configured in the form of a general linear binary DAC. For example, assuming that p is 12 bits, q is 5 bits and p-q is 7 bits, 6 kinds of current sources are sufficient for the linear binary DAC, and the largest current source is just 64 times as large as the small current source. In the meantime, a combination configuration determined by 16 linear current sources and a select switch may be also sufficient for the q bits.

However, in order to apply the above-configured DAC to a DDFS, an integral amplitude binary value has to be completed in the PAM prior to the DAC and delivered to the DAC, with resolution fixed by the number of bits of such an amplitude binary value.

Figure 4:
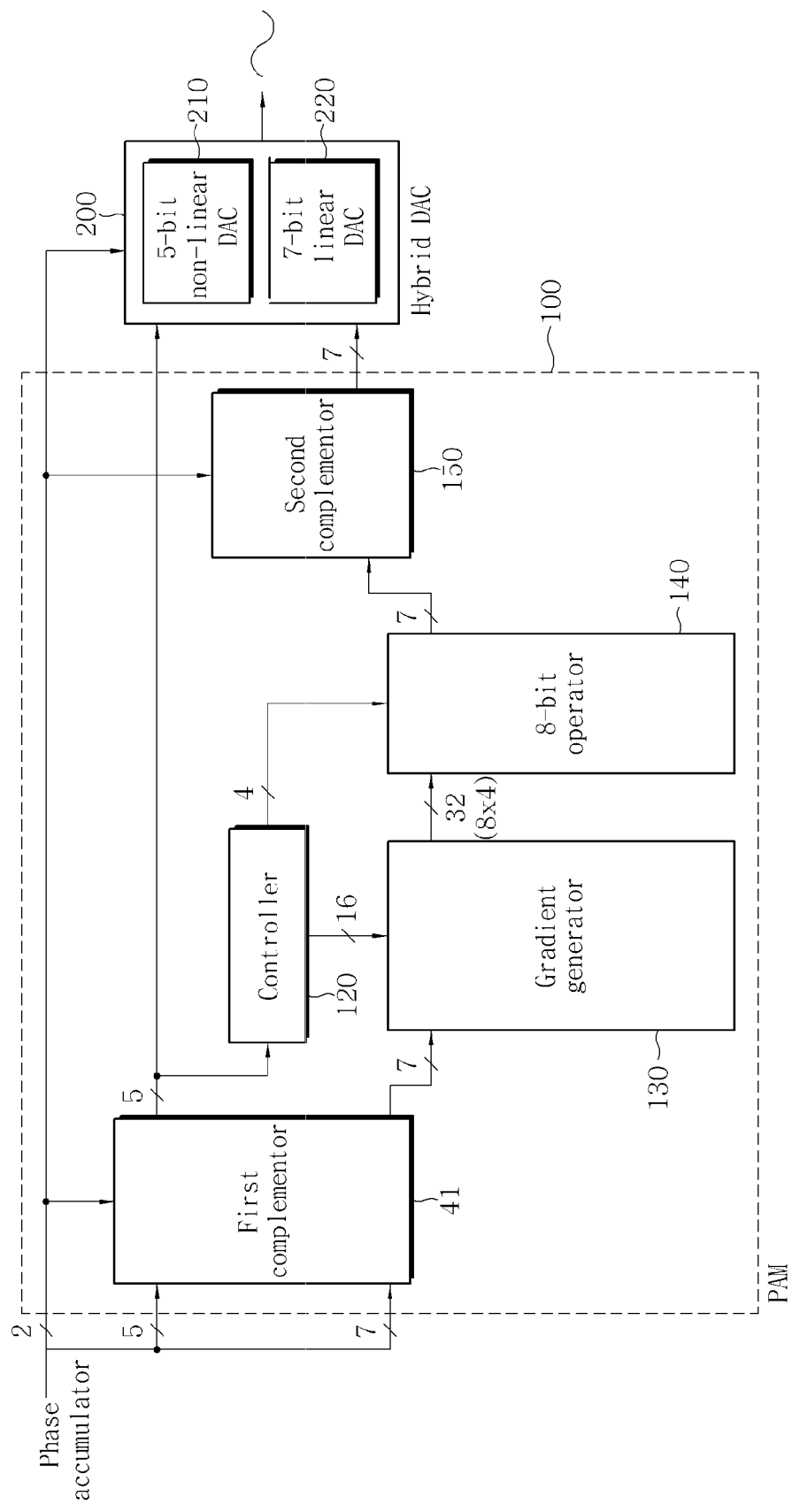
FIG. 4 is a view showing a configuration of a direct digital frequency synthesizer according to an embodiment of the present invention.

FIG. 4 shows a PAM 100 and a DAC 200 according an embodiment of the present invention. As shown, the base decoder for specifying base points is excluded from the conventional PAM configuration and the configuration of the operator for generation of gradient is simplified. In the meantime, this embodiment provides a hybrid DAC 200 including a non-linear DAC 210 for outputting a base point current of low resolution, rather than using applied amplitude data of a single form, and a linear DAC 220 for obtaining a current corresponding to an extension gradient for increase of resolution by interconnecting the obtained base points of low resolution in a linear approximation manner.

That is, some upper bits (5 bits in this example) of the phase data provided from the phase accumulator are used as dedicated data for directly generating base points of low resolution, and other lower bits (7 bits in this example) are used as data for generating a gradient for linear approximation.

As shown, this embodiment provides complementors for operating only amplitude for a quarter sine wave phase for simplification of a sine wave matching operation configuration and switching reference amplitudes into different phase regions when it is configured to expand the quarter sine wave phase to a full sine wave phase.

Figure 5:
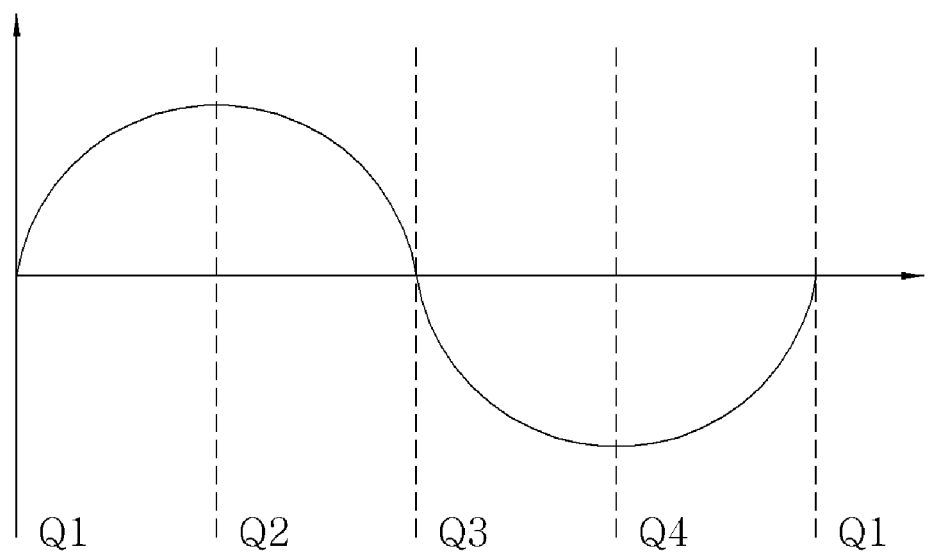
FIG. 5 is a conceptual view for explaining ¼ sine wave phase extension.

In a sine wave configuration shown in FIG. 5, a configuration to obtain amplitude for a first phase domain Q1 is provided, a first complementor 110 shown is operated in order to expand such select amplitude to a second phase domain Q2, a second complementor 150 shown is operated in order to expand such select amplitude to a third phase domain Q3, and the first complementor 110 and the second complementor 150 are operated at once in order to expand such select amplitude to a fourth phase domain Q4.

To this end, the two most significant bits of the phase data provided from the phase accumulator are used to expand a sine wave phase.

Now, the detailed configuration shown in FIG. 4 will be described by way of example.

The shown Pam 100 includes the first complementor 110 for selectively performing a complementary operation for first data of upper 5 bits and second data of lower 7 bits of the lower 10 bits of the 12 bit output data of the phase accumulator using the most significant two bits and providing a result value of the selective complementary operation for the first data to the non-linear DAC 210 of the direct hybrid DAC 200; a unit gradient generator 130 for generating unit gradients using the first data and second data selectively complementary-operated in the first complementor 110; a 8-bit operator 140 for performing an addition/subtraction combination operation for the unit gradients generated in the unit gradient generator 130 using the selectively complementary-operated first data; a controller 120 for providing shift values to the gradient generator 130 using the first data and generating a control signal to perform addition/subtraction combination for the unit gradients generated in the unit gradient generator 130; and the second complementor 150 for selectively performing a complementary operation for an output of the 8-bit operator 140 using the most significant two bits of the phase accumulator.

Here, the controller 120 maps the first data selectively complementary-operated by the first complementor 110 onto at least one encoded shift value and provides a result of the mapping to the unit gradient generator 130. The unit gradient generator 130 generates unit gradients for obtaining gradients between base points from the second data selectively complementary-operated by the first complementor 110 and provides the generated unit gradients to the 8-bit operator 140. The 8-bit operator 140 receives the 32-bit unit gradient (four 8-bit unit gradients) from the unit gradient generator 130 and the 4-bit information from the controller for obtaining a desired gradient by performing addition/subtraction (or scaling) combination for the unit gradients, obtains a totally gradient, and then outputs upper 8 bits of the gradient. If the configuration of the unit gradient generator 130 is changed to obtain a 7-bit unit gradient, the operator may be replaced by a 7-bit operator whose output may be 7 bits. That is, the size of the operator may be determined depending on a unit gradient resolution of the unit gradient generator.

The unit gradient generator 130 generates different values while shifting the input 7-bit second data recursively and produces four 8-bit unit gradients (their number and size may be changed) by combination of the generated different values according to a selection by the controller 120. The configuration of operating the unit gradients for linear approximation using such simple shift used in the shown embodiment is similar to the above configuration of the unit gradient generator and controller of FIG. 2. However, it is noted that the configuration of the operator is completely different. Of course, the configuration of the gradient generator used in this embodiment is not limited to the shown one but the gradient generator may be configured at random as long as it can provide an expansion gradient for effective linear approximation between base points as a value for linear DAC.

The present invention does not provide data provided to the hybrid DAC 200 as a single binary amplitude value, but provides base point generation bits for generation of coarse segments and binary amplitude values for linear approximation between coarse segments separately.

In the end, there is no need to use an operator having a size corresponding to a DAC input resolution in order to generate a single binary value. That is, a 12-bit operator having the same size as DAC input resolution of an output of a base decoder as previous may be replaced by a 8-bit operator for performing addition/subtraction combination for only unit gradient values. Such a difference of upper 4 bits means a difference by 16 times in size between an operator and a pipeline, which in actual means remarkable reduction of complexity, delay and power consumption in the PAM configuration over the existing methods.

Figure 6:
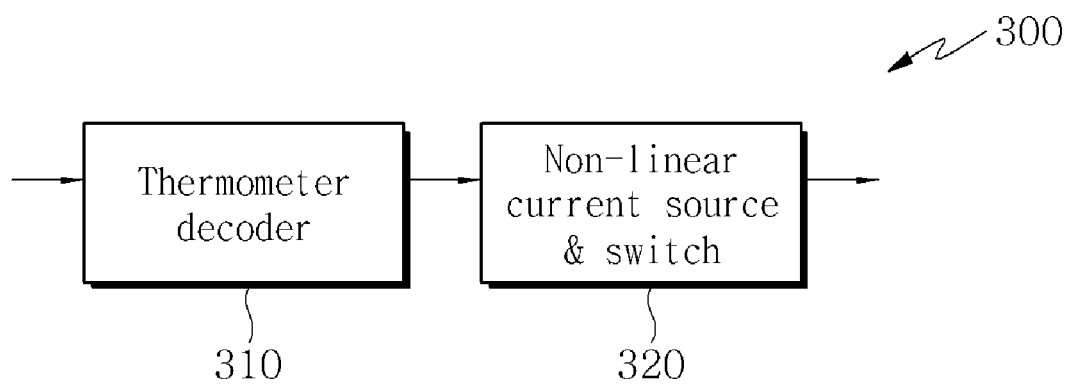
FIG. 6 is a view showing a configuration of a non-linear DAC according to an embodiment of the present invention.

As shown in FIG. 6, the 5-bit non-linear DAC 210 of the hybrid DAC 200 includes a thermometer decoder 310 and a non-linear current source & switch 320 corresponding to outputs of the thermometer decoder 310.

In the above example, the shown thermometer decoder 310 has 31 outputs, and accordingly, 31 pairs of non-linear current source and switch of the non-linear current source & switch 320 are provided. In the end, N switch is turned on depending on an output of the thermometer decoder 310, and N non-linear current source connected to the corresponding switch is operated, thereby providing a current having N of the 31 non-linear weights and hence producing a base point current.

Referring to FIG. 4 again, since the 5-bit data of the phase accumulator are selectively complementary-operated by the first complementor 110 and then directly input to the 5-bit non-linear DAC 210, a complementary operation corresponding to the second complementor has to be selectively possible in order to expand a phase for quarter sine wave amplitude to a full sine wave phase. Accordingly, In the 5-bit non-linear DAC 210 shown in FIG. 6, between the thermometer decoder 310 and the non-linear current source & switch 320 may be provided a complementor for selectively performing a complementary operation for an output of the thermometer decoder 310 depending on the most significant bit of the phase accumulator.

The hybrid DAC according to this embodiment outputs the sum of current produced by the non-linear DAC and current produced by the linear binary DAC (another 1-bit DAC could be added as FIG. 12.) as shown in FIG. 6. Such current produced depending on on/off switch is referred to as current steering. Outputs of the DACs with such current steering can be summed without a separate summing circuit. In the meantime, the linear binary DAC may have a delay block for synchronization of the different DACs and pipelines for operation synchronization of the hybrid DAC.

Although a linear DAC included in the hybrid DAC is preferably a linear binary DAC which includes sources applied with a binary weight and switches selectively interconnecting the sources to produce a desired output current by opening/closing switches combined depending on an input binary value, the linear DAC is not necessarily limited to this linear binary DAC but may be any of other kinds of linear DACs.

In the meantime, although not shown in the hybrid DAC of the present invention, the hybrid DAC may further include a one-bit DAC for shifting amplitude depending on a phase between p and 2p for phase expansion of a quarter sine wave signal, for which one of the most significant two bits of the phase accumulator may be used.

FIG. 7 shows weights for non-linear current sources of the shown 5-bit nonlinear DAC. Current sources with non-linear weights as shown are individually configured to form the non-linear DAC, each of which is selected by a corresponding switch. The weights correspond to base points and also correspond sequentially to values of the next upper 5 bits of the output of the phase accumulator input to the non-linear DAC. Inspection of differences in current weights between segments depending on the shown weights shows that a difference between segments decreases non-linearly from a lower segment to an upper segment.

The 5-bit non-linear DAC shown in this embodiment is configured by 31 different non-linear current sources, which is no so much difficult to implement. As will be described later with an example shown in FIG. 12, since the non-linear DAC allows an output of considerably precise resolution only with a 4 bits configuration, that is, a configuration of 15 non-linear current sources, it is possible to minimize a burden due to such a non-linear current source configuration.

Figure 8:
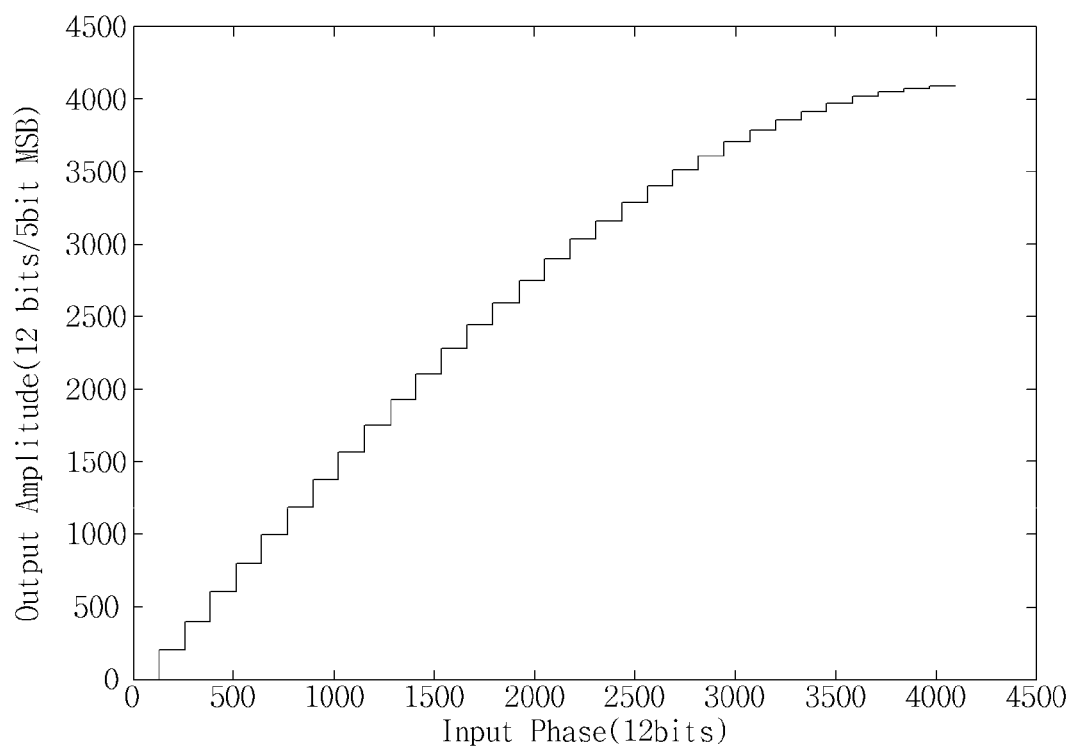
FIG. 8 is a view showing an output waveform of a non-linear DAC according to an embodiment of the present invention.

FIG. 8 is a graph showing an output from the 5-bit non-linear DAC. As shown, as an increase rate of amplitude decreases non-linearly with increase of a phase by non-linear weights, the output has the form to trace a quarter sine wave curve.

The shown graph shows the output on the basis of 12-bit phase data for generating quarter sine wave amplitude of the 14-bit phase data output from the phase accumulator, except the most significant two bits for quarter sine wave phase expansion. In the end, since the output is a non-linear output for upper 5 bits, the output is maintained to produce segments as unit outputs while lower 8 bits are being changed. In actual, since such segments have to represent all quarter sine wave amplitudes with low resolution of 5 bits, the segments have a coarse segment configuration represented coarsely in a stepped fashion and act as the basis for change of the lower 8 bits in which corresponding values (base points) are maintained.

Figure 9:
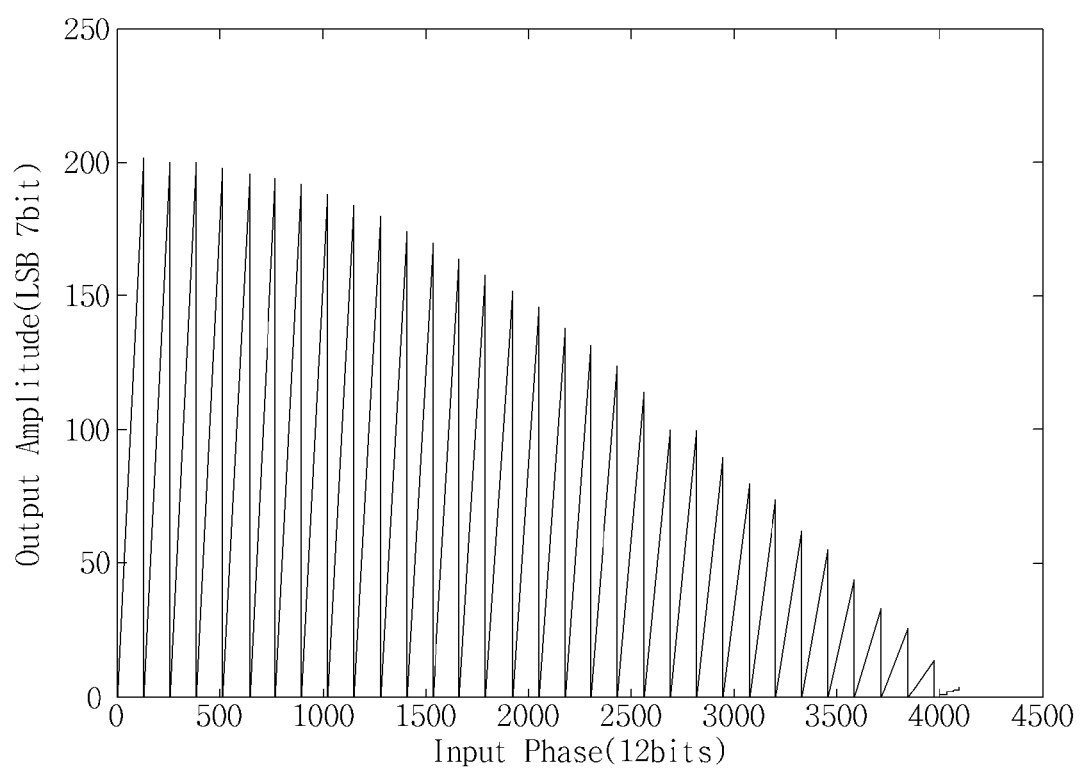
FIG. 9 is a view showing an output waveform of a linear DAC according to an embodiment of the present invention.

FIG. 9 shows an output of the 8-bit linear DAC shown in FIG. 4 on the basis of the 12-bit phase data for the quarter sine wave amplitude of the phase accumulator. The output of the 8-bit linear DAC is an output depending on binary values of the gradients generated using the upper 5 bits and lower 7 bits of the 12-bit phase data. As shown, this output has the form that a gradient increases and then decreases in the unit of coarse segment. The maximum of gradient in each unit region is non-linearly reduced with phase increase, like non-linear change of coarse segments.

Figure 10:
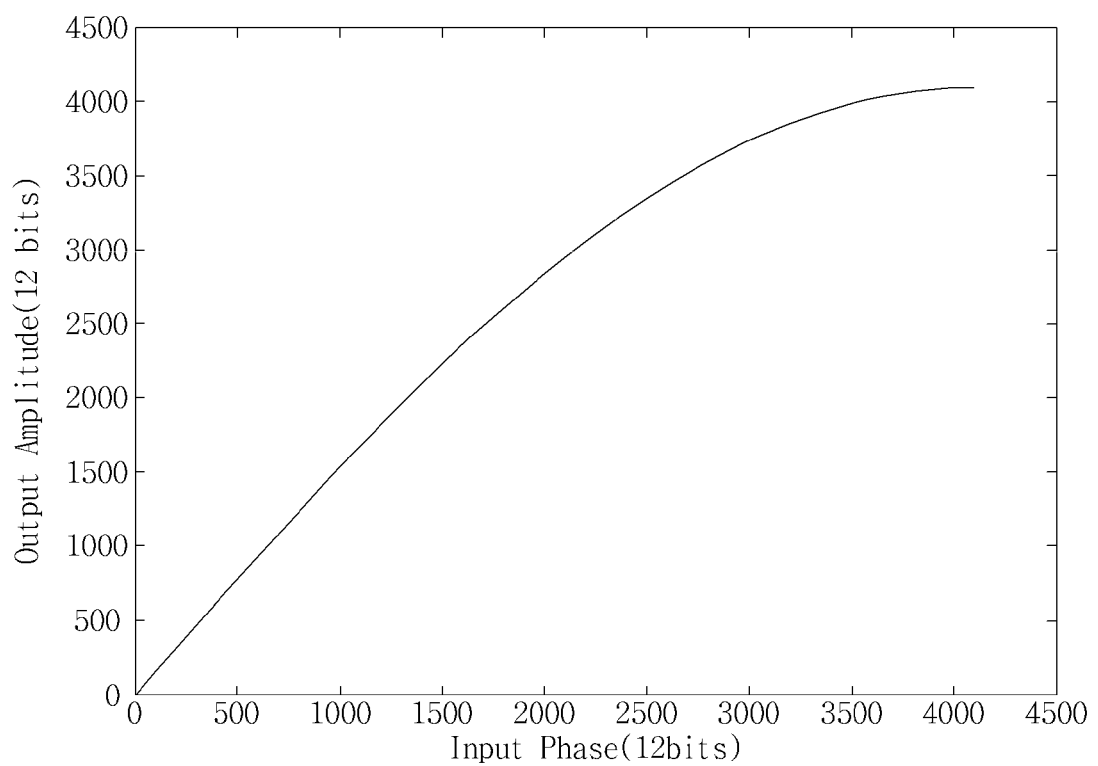
FIG. 10 is a view showing an output waveform of a hybrid DAC according to an embodiment of the present invention.
Figure 11:
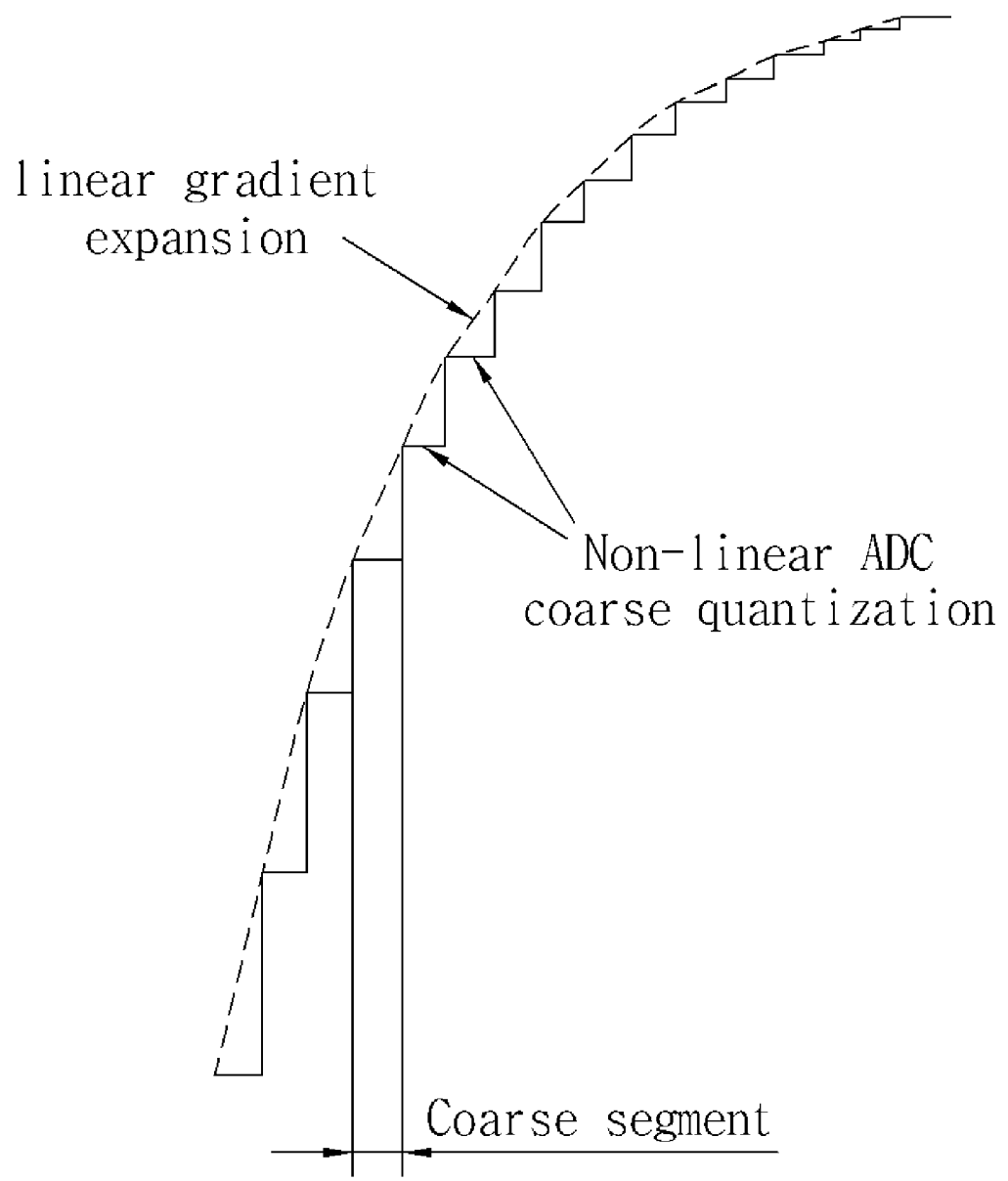
FIG. 11 is a conceptual view showing an output waveform combining method of a hybrid DAC.

In the end, as shown in FIG. 10, combination of the outputs shown in FIGS. 8 and 9 gives the output of the hybrid DAC, which shows substantially precise approximation of an actual sine wave. (While values including amplitude information according to a full sine wave phase are provided from a PAM to a linear DAC as binary values having resolution of 12 bits in the existing system, the embodiment of the present invention can use all of 12 bits to represent amplitude since the information to produce base points and the information to provide gradients for the base points are separately provided to the 5-bit nonlinear DAC and the 8-bit linear DAC, respectively. Accordingly, in the present invention, by including a separate DAC for shifting amplitude using one of the most significant two bits used for quarter sine wave expansion of the output of the phase accumulator in the hybrid DAC, it is possible to provide an analog output with 13-bit resolution while simplifying the configuration of PAM.)—FIG. 2 also need MSB shifting to produce 13-bit output for 14-bit phase. FIG. 11 shows a process of linearly approximating values between coarse segments by applying linear gradient expansion values (outputs of FIG. 9) to coarse segments (outputs of FIG. 8) output from the non-linear DAC. Since this process is performed for each phase output of the phase accumulator, one coarse segment is linearly approximated 128 times with a precise gradient, which may result in very precise output.

Figure 12:
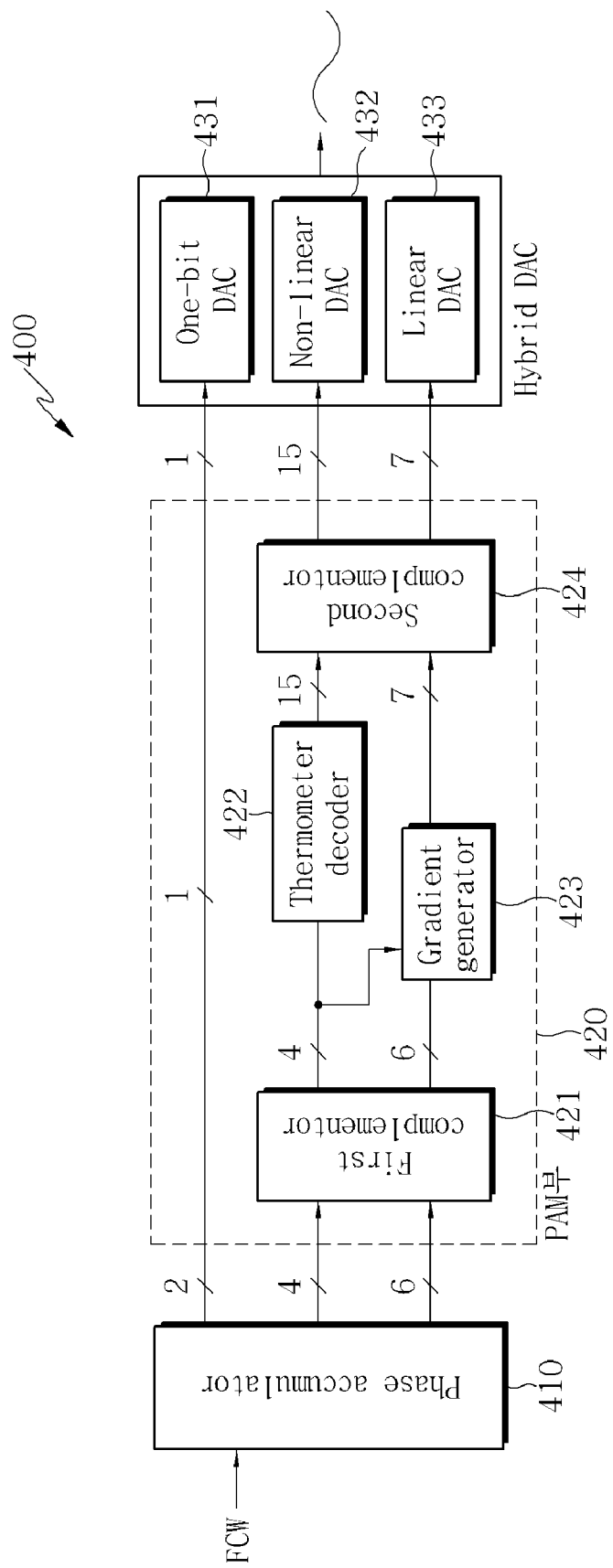
FIG. 12 is a view showing a configuration of a direct digital frequency synthesizer according to another embodiment of the present invention.

FIG. 12 shows a simplification of the configuration shown in FIG. 3 according to another embodiment of the present invention.

As shown, a phase accumulator 810 input with a FCW (24 bits) outputs 12 bits of the FCW as phase angles and provides these 12 bits to a PAM 420. A hybrid DAC 430 converts an output of the PAM 420 into an analog signal.

The PAM 420 identifies the most significant two bits of the 12-bit output of the phase accumulator as first data for quarter sine wave phase expansion, identifies the next upper 4 bits as second data for base point setting, and identifies the lower 6 bits as third data for generation of gradients for linear approximation.

The PAM 420 includes a first complementor 421 and a second complementor 424 for phase expansion, between which a gradient generator 423 for gradient generation is interposed similarly to the configuration of FIG. 4. The gradient generator 423 may include a controller for generating a shift signal for generation of unit gradients and a signal to control a combination of unit gradients using the 4-bit second data, a gradient generating unit for generating 7-bit unit gradients using the 6-bit third data and the shift signal from the controller, and a 7-bit operator for performing an operation using the unit gradients provided from the gradient generating unit and a signal to control an addition/subtraction combination of the unit gradients provided from the controller.

A thermometer decoder 422 connected to the first complementor 421 has a configuration applied to a non-linear DAC 432 of the hybrid DAC 430 in the PAM. Also, a portion of the second complementor 424 connected to an 15-bit output of the thermometer decoder 422 has a portion existing in the nonlinear DAC 432 in the PAM. This portion is integrated with the second complementor 424 existing between the existing gradient generator 423 and the linear DAC 433.

The complementors 421 and 424 may be substantially configured by XOR logic circuits for XORing their respective separated input data.

The hybrid DAC 430 includes a one bit DAC 431 operated by one bit of the most significant two bits of the phase accumulator for shifting for phase expansion, a 4-bit non-linear DAC 432 having only switches and non-linear current sources as the thermometer 422 and a portion of the second complementor 424 are included in the PAM 420, and a linear binary DAC 433 for generating gradients by selectively complementary-operated outputs of the gradient generator 423. That is, the hybrid DAC 430 has substantially 11-bit resolution.

In the shown example, since the PAM 420 using 12-bit digital phase angles includes the gradient generator 423 for performing a 7-bit operation, and pipelines and the thermometer decoder 422 for processing data for 4-bit base point selection and 6-bit gradient generation, complexity is greatly reduced. Also, since the non-linear DAC is based on bits, the number of non-linear current sources is sufficient to be 15 or so.

In the end, since the configuration of the embodiment shown in FIG. 12 is half as complicated as the configuration of the embodiment shown in FIG. 4, its size and current consumption can be greatly reduced accordingly.

In the meantime, the configuration having low complexity of the present invention can be achieved through a common CMOS process, rather than a BiCMOS process using SiGe or an InP process using a double hetero-junction bipolar transistor (DHBT) technique, which is difficult to implement integrated circuits, as in the existing DDFSs. Also, since the configuration of the present invention can provide extremely small size and low power consumption while providing similar functions, its FOM (Figure Of Merit) is very large.

The following Table 1 shows comparison between the design of FIG. 12 according to the embodiment of the present invention and other designs using similar DDFS techniques, through which excellent performance of the DDFS according to the embodiment of the present invention can be confirmed. The performance is calculated on the basis of $GHz \cdot 2^{effective\ bit\ number}/W$.

TABLE 1

|  | Embodiment of the Invention | Comparative example 1 | Comparative example 2 | Comparative example 3 |
|---|---|---|---|---|
| Process | CMOS | SiGe | InP | SiGe |
| FCW width | 24 bits | 32 bits | 8 bits | 11 bits |
| Amplitude resolution | 11 bits | 12 bits | 4 bits | 10 bits |
|  | Hybrid | Linear | Non-linear | Non-linear |
| Nyquist output power | −9 dBm | −8 dBm | N/A | −34 dBm |
| Maximum clock | 1.3 GHz | 1.7 GHz | 32 GHz | 8.6 GHz |
| Die area | 2 mm² | 24 mm² | 3.9 mm² | 14 mm² |
| Worst SFDR | 52 dBc | 50 dBc | 22 dBc | 40 dBc |
| Power consumption | 0.35 W | 3 W | 9.45 W | 4.8 W |
| FOM | 1207.9 | 146.1 | 34.8 | 182.0 |

From the above Table 1, it can be seen that the DDFS according to the embodiment of the invention has the smallest area, the lowest power consumption, and the best SEDR (Spurious Free Dynamic Range) property as compared to other comparative examples.

While the present invention has been particularly shown and described with reference to exemplary embodiments thereof, it will be understood by those skilled in the art that various changes in form and details may be made therein without departing from the spirit and scope of the present invention. The exemplary embodiments are provided for the purpose of illustrating the invention, not in a limitative sense. Thus, it is intended that the present invention covers the modifications and variations of this invention provided they come within the scope of the appended claims and their equivalents.

What is claimed is:

1. A direct digital frequency synthesizer using a hybrid digital to analog converter, comprising:
    a hybrid DAC (digital to analog Converter) that includes a non-linear DAC part for generating a current corresponding to base points in a non-linear manner, and a linear DAC part for generating a current corresponding to a gradient for linear approximation, which interconnects the base points, and sums and outputs the currents of the DAC parts; and
    a PAM (phase to amplitude mapper) that provides upper first data of output data of an external phase accumulator to the non-linear DAC part of the hybrid DAC, generates a gradient using the first data and lower second data of the output data, and provides the generated gradient to the linear DAC part of the hybrid DAC.

2. The direct digital frequency synthesizer according to claim 1, wherein the PAM includes a plurality of complementors that uses the uppermost third data of the output data of the phase accumulator to locate the correct guardant with respect to amplitude of a quarter sine wave region operated using the first and second data.

3. The direct digital frequency synthesizer according to claim 2, wherein the hybrid DAC further includes a one-bit DAC that uses one bit of the third data to determine whether or not amplitude obtained through the non-linear DAC part and the linear DAC part is shifted.

4. The direct digital frequency synthesizer according to claim 1, wherein the PAM includes:
   a first complementor that uses the third data corresponding to the most significant two bits of the output data of the phase accumulator to perform a selectively complementary operation for the first data and the second data, and provides the selectively complementary-operated first data to the non-linear DAC part;
   a gradient generator that uses the first data and the second data selectively complementary-operated in the first complementor to generate unit gradients, and performs an addition/subtraction combining operation to generate binary values of linear approximation values using the selectively complementary-operated second data; and
   a second complementor that uses the third data to perform a selectively complementary operation for an output of the gradient generator, and provides the selectively complementary-operated output to the linear DAC part.

5. The direct digital frequency synthesizer according to claim 1, wherein the non-linear DAC of the hybrid DAC is configured by a DAC having less than 5 bits as an input.

6. The direct digital frequency synthesizer according to claim 1, wherein the non-linear DAC of the hybrid DAC includes:
   a thermometer decoder that provides a single selection output according to input data;
   switches of the number corresponding to the number of outputs of the thermometer decoder, the switches being operated depending on values selected by the thermometer decoder; and
   a non-linear current source connected to each of the switches for providing a non-linear current.

7. The direct digital frequency synthesizer according to claim 6, wherein the hybrid DAC further includes a delay block that delays the operation of the linear DAC to synchronize the operation of the thermometer decoder included in the non-linear DAC with the operation of the linear DAC.

8. The direct digital frequency synthesizer according to claim 6, further comprising a complementor that is interposed between the thermometer and the switches for selecting a quadrant using the third data provided by the phase accumulator.

9. The direct digital frequency synthesizer according to claim 1, wherein the hybrid DAC includes a one-bit linear DAC that shifts generation amplitude according to shifting-designation data of the data provided by the phase accumulator, a non-linear DAC of less than 5 bits that generates a current corresponding to base points according to base point-designation data, and a linear binary DAC of less than 7 bits that generates a current according to a gradient between the base points based on binary values for a linear approximation gradient.

10. A direct digital frequency synthesizing method using a hybrid digital to analog converter, comprising:
    a data division step of dividing an output of a phase accumulator into first data for base point designation and second data for linear approximation;
    a base point mapping step of directly providing the first data to a non-linear DAC of a hybrid DAC including the non-linear DAC and a linear DAC;
    a gradient generation step of generating binary values for a gradient for linear approximation using the second data and the first data and providing the generated binary values to the linear DAC; and
    a conversion step of generating base point currents in the non-linear DAC by connecting a non-linear current source corresponding to the first data to the non-linear DAC, and generating and summing expansion gradient currents corresponding to the gradient binary values in the linear DAC.

11. The direct digital frequency synthesizing method according to claim 10, wherein, in the data division step, the output of the phase accumulator further includes third data of the most significant two bits for phase determination of quarter sine wave amplitude,
    further comprising:
    a first expansion step of selectively converting the first and second data into complementary numbers according to the third data before the base point matching step and the gradient generation step; and
    a second expansion step of selectively performing the complementary operation according to the third data after the gradient generation step and during generation of the base point currents of the non-linear DAC in the conversion step.

12. The direct digital frequency synthesizing method according to claim 11, wherein the hybrid DAC includes a one-bit DAC for selective shifting depending on the phase determination, and the second expansion step further includes a step of determining whether or not the shifting is performed according to one bit from the third data.

13. The direct digital frequency synthesizing method according to claim 10, wherein the conversion step includes a step in which the non-linear DAC thermometer-decodes the first data received, selects one of switches of the number corresponding to the number of outputs of a thermometer decoder, selects one of current sources having a non-linear size for each of the switches, and outputs an output of the sum of selected current source as a base point current.

* * * * *